United States Patent
Nakamura

(12) 
(10) Patent No.: US 11,683,909 B2
(45) Date of Patent: Jun. 20, 2023

(54) COLD PLATE, DEVICE, AND CONNECTION TUBE FOR COLD PLATE

(71) Applicant: NEC Platforms, Ltd., Kawasaki (JP)

(72) Inventor: Yasuhito Nakamura, Kanagawa (JP)

(73) Assignee: NEC Platforms, Ltd., Kanagawa (JP)

(*) Notice: Subject to any disclaimer, the term of this patent is extended or adjusted under 35 U.S.C. 154(b) by 185 days.

(21) Appl. No.: 17/413,770

(22) PCT Filed: Nov. 28, 2019

(86) PCT No.: PCT/JP2019/046579
§ 371 (c)(1),
(2) Date: Jun. 14, 2021

(87) PCT Pub. No.: WO2020/137340
PCT Pub. Date: Jul. 2, 2020

(65) Prior Publication Data
US 2022/0039289 A1 Feb. 3, 2022

(30) Foreign Application Priority Data
Dec. 27, 2018 (JP) .............................. JP2018-245995

(51) Int. Cl.
*H05K 7/20* (2006.01)

(52) U.S. Cl.
CPC ..... *H05K 7/20254* (2013.01); *H05K 7/20509* (2013.01); *H05K 7/20627* (2013.01)

(58) Field of Classification Search
CPC ........... H05K 7/20254; H05K 7/20509; H05K 7/20627; H05K 7/20636; F16L 27/08; G06F 1/20; H01L 23/473
See application file for complete search history.

(56) References Cited

U.S. PATENT DOCUMENTS

| | | | |
|---|---|---|---|
| 5,043,797 A * | 8/1991 | Lopes | H01L 23/473 257/E23.098 |
| 5,144,531 A | 9/1992 | Go et al. | |
| 2013/0105116 A1 | 5/2013 | Campbell et al. | |

(Continued)

FOREIGN PATENT DOCUMENTS

| | | | | |
|---|---|---|---|---|
| CN | 102548337 A | * | 7/2012 | |
| CN | 108076611 A | * | 5/2018 | ............... F28D 1/03 |

(Continued)

OTHER PUBLICATIONS

International Search Report for PCT Application No. PCT/JP2019/046579, dated Mar. 3, 2020.

(Continued)

*Primary Examiner* — Emmanuel E Duke
(74) *Attorney, Agent, or Firm* — Sughrue Mion, PLLC

(57) ABSTRACT

A cold plate has, on a surface thereof, an attachment surface for contacting a cooling object, and has, in the interior thereof, an accommodating portion that accommodates a cooling medium. The cold plate is provided with a first opening that communicates with the accommodating portion, a body-side connection pipe is connected to the first opening, a tube-side connection pipe, which has a bendable tube connected to one end thereof, is connected to the body-side connection pipe. The body-side connection pipe and the tube-side connection pipe are connected so as to be able to rotate about the pipe axis.

6 Claims, 7 Drawing Sheets

(56) References Cited

U.S. PATENT DOCUMENTS

| | | | | |
|---|---|---|---|---|
| 2013/0291368 A1* | 11/2013 | Davidson | ........... | H05K 7/20809 439/485 |
| 2015/0334879 A1* | 11/2015 | Fricker | .............. | H05K 7/20809 361/679.47 |
| 2016/0059367 A1* | 3/2016 | Brunschwiler | ....... | F16L 37/138 29/428 |
| 2018/0149294 A1 | 5/2018 | Brunschwiler et al. | | |

FOREIGN PATENT DOCUMENTS

| | | | | |
|---|---|---|---|---|
| JP | H03208365 A | | 9/1991 | |
| JP | H09264456 A | | 10/1997 | |
| JP | 2000338173 A | | 12/2000 | |
| JP | 2001111279 A | | 4/2001 | |
| JP | 2005317013 A | * | 11/2005 | ............... G06F 1/20 |
| JP | 3773797 B2 | | 5/2006 | |
| JP | 2010244546 A | * | 10/2010 | ............ F16L 13/141 |
| JP | 2015501489 A | | 1/2015 | |
| WO | 2013063250 A1 | | 5/2013 | |

OTHER PUBLICATIONS

JP Office Action for JP Application No. 2018-245993, dated Feb. 24, 2021 with English Translation.

\* cited by examiner

COLD PLATE, DEVICE, AND CONNECTION TUBE FOR COLD PLATE

This application is a National Stage Entry of PCT/JP2019/046579 filed on Nov. 28, 2019, which claims priority from Japanese Patent Application 2018-245995 filed on Dec. 27, 2018, the contents of all of which are incorporated herein by reference, in their entirety.

TECHNICAL FIELD

The present invention relates to a cold plate, a device, and a connection tube used for connection of a cold plate.

BACKGROUND ART

Patent Document 1 describes a technique related to a cold plate for cooling a heat-generating component such as a semiconductor.

FIG. 8 shows an outline of the cold plate described in Patent Document 1. As shown in FIG. 8, a plurality of cold plates A are connected in series by connectors B. Further, each connector B has a structure that can be expanded and contracted by being formed in a bellows shape. The cooling water supplied to the supply port of one cold plate A through the pipe C is discharged from a discharge port, supplied to the supply port of the cold plate A downstream through the connector B, discharged from the discharge port thereof, and in turn supplied to the cold plate further downstream.

The cold plate A can be moved up and down, left and right by bending the bellows-shaped connector. That is, the plurality of cold plates can be attached to or detached from the target heat-generating component or the like while bending the connector to adjust the relative positions.

PRIOR ART DOCUMENTS

Patent Documents

[Patent Document 1] Japanese Patent No. 3773797
[Patent Document 2] Published Japanese Translation No. 2015-501489 of the PCT International Publication
[Patent Document 3] Japanese Unexamined Patent Application No. H03-208365

DISCLOSURE OF THE INVENTION

Problems to be Solved by the Invention

However, the connector B has a structure in which a material such as rubber or plastic is molded in a bellows shape. Such a bellows-like structure lacks durability against repeated deformation due to an external force as compared with a normal smooth pipe or tube. In particular, no consideration is given to torsional deformation of the bellows-shaped connector B around the pipe axis. Further, if the wall thickness is increased or a high-strength material is used in order to increase the durability of the tube, the flexibility originally required for the tube is impaired.

Patent Document 2 discloses a configuration in which a coolant is supplied and recovered in parallel from a branch manifold to a supply pipe and a discharge pipe.

However, it does not disclose a configuration of pipes for mutual connection of a plurality of cold plates connected in series. Further, even if the configuration allows the supply pipe and the discharge pipe to rotate with respect to the branch manifold, no consideration is given to torsional deformation of the supply pipe and the discharge pipe around the pipe axis.

Further, Patent Document 3 merely discloses a configuration in which the supply pipe and the discharge pipe are connected by a flexible tube, with no consideration given to torsional deformation of the flexible tube around the tube axis.

That is, according to the techniques disclosed in Patent Documents 1 to 3, it is not possible to prevent damage caused by deformation of the coolant supply pipe and the discharge pipe itself around the pipe axis.

An object of the present invention is to prevent deformation of a connection pipe and/or a tube that supplies and discharges a coolant to a cold plate about the pipe axis.

Means for Solving the Problems

In order to solve the above problems, the present invention proposes the following means.

The cold plate according to the first aspect of the present invention has a main body for accommodating a coolant in an accommodating portion surrounded by a plurality of surfaces including an attachment surface for contacting a cooling object, a body-side connection portion with a pipe shape that is attached to a first opening that communicates with the accommodating portion of the main body, and a tube-side connection portion of which one end is rotatably attached to the body-side connection portion about the pipe axis and to the other end of which a tube is connected.

The connection pipe of the cold plate according to the second aspect of the present invention has a body-side connection portion with a pipe shape that is attached to a first opening that communicates with the accommodating portion of the main body for accommodating a coolant in an accommodating portion surrounded by a plurality of surfaces including an attachment surface for contacting a cooling object, and a tube-side connection portion of which one end is rotatably attached to the body-side connection portion about a pipe axis and a tube is connected to the other end.

Effects of the Invention

According to the present invention, it is possible to prevent twisting of a connection pipe connected to a cold plate.

EXAMPLE EMBODIMENTS

Figure 1A:
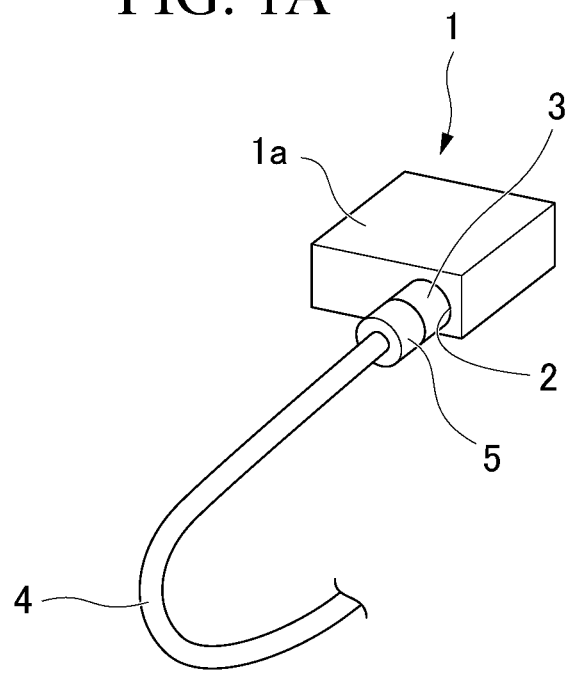
FIG. 1A is a perspective view showing a cold plate according to the minimum configuration of the present invention.

A minimum configuration example of the cold plate and the connection pipe according to the embodiment of the present invention will be described with reference to FIGS. 1A and 1B.

The cold plate 1 has an attachment surface 1a on the surface for contacting with a cooling object, and has an accommodating portion for accommodating a cooling medium inside. The cold plate 1 is provided with a first opening 2 that communicates with the accommodating portion. A body-side connection pipe 3 is connected to the first opening 2. A tube-side connection pipe 5 to which a flexible tube 4 is connected to one end thereof is connected to the body-side connection pipe 3. The body-side connection pipe 3 and the tube-side connection pipe 5 are rotatably connected about the axes of the pipes.

The cold plate 1 having the above configuration is used in a state where the attachment surface 1a is in contact with an electronic component such as a semiconductor chip serving as a heat-generating component to be cooled. The cold plate 1 can supply or discharge a coolant such as water to the accommodating portion via the body-side connection pipe 3, the tube-side connection pipe 5, and the tube 4 connected to the first opening 2. Since the body-side connection pipe 3 and the tube-side connection pipe 5 can mutually rotate, bending of the tube 4 is minimized during attachment to and detachment from a cooling target such as an electronic component, and so damage due to twisting can be prevented. Further, it is possible to minimize such phenomenon as the internal coolant being excessively compressed or flowing back due to the tube 4 being broken.

Figure 1B:
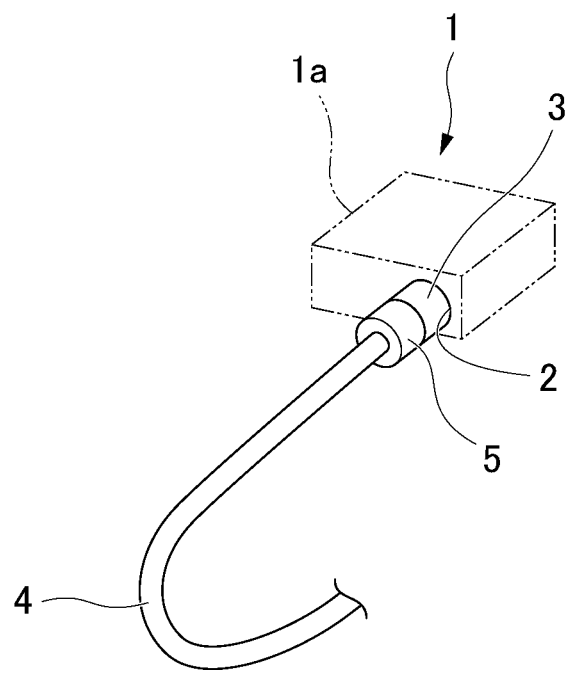
FIG. 1B is a perspective view showing a connection tube of a cold plate according to the minimum configuration of the present invention.

FIG. 1B shows an example of the minimum configuration of the connection pipe. The body-side connection pipe 3 is attached to the first opening 2 of the cold plate 1. A tube-side connection pipe 5 is rotatably attached to the body-side connection pipe 3 about a pipe axis.

The connection pipe configured in this way can supply or discharge a coolant such as water to/from the cold plate 1 via the body-side connection pipe 3, the tube-side connection pipe 5, and the tube 4 connected to the first opening 2. Further, the body-side connection pipe 3 and the tube-side connection pipe 5 can mutually rotate. Therefore, bending of the tube 4 is minimized during attachment to and detachment from a cooling target such as an electronic component, whereby damage due to twisting can be prevented. Further, it is possible to minimize such phenomena as the internal coolant being excessively compressed or flowing back due to the tube 4 being broken.

The first embodiment of the present invention will be described with reference to FIGS. 2 to 5. The same reference numerals are given to configurations common to those in FIGS. 1A and 1B, and descriptions thereof will be omitted.

Figure 2:
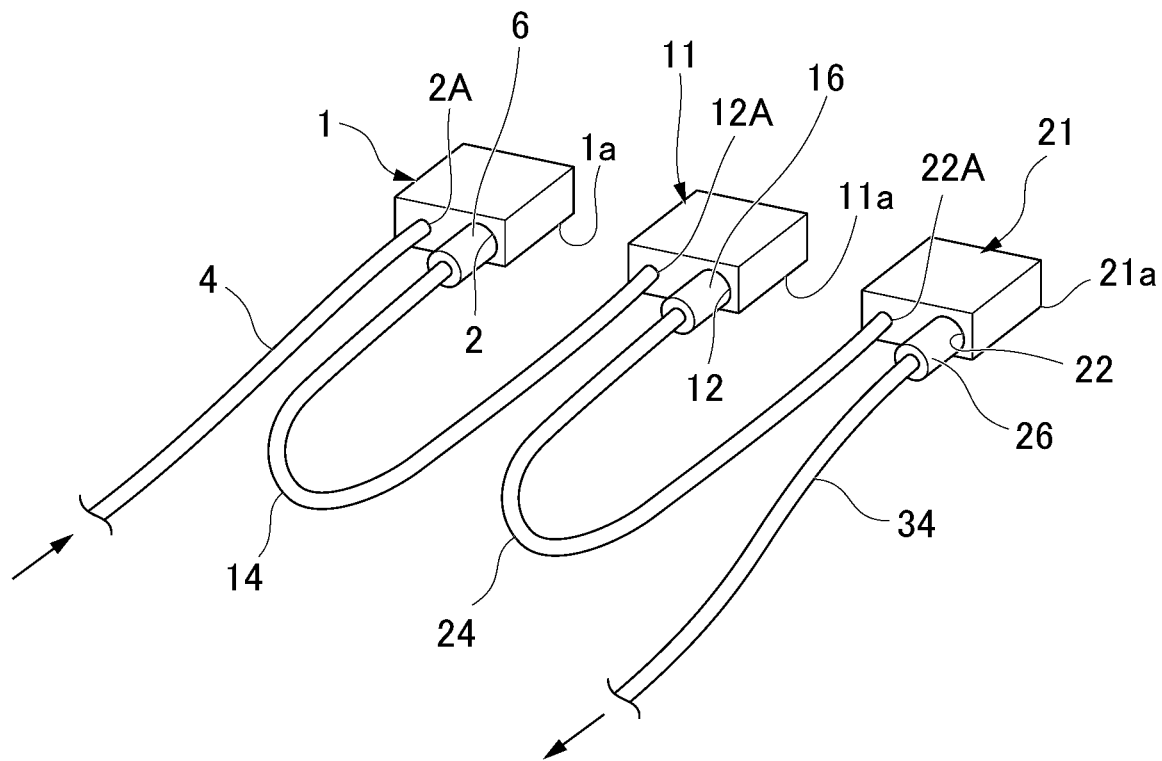
FIG. 2 is a perspective view showing a first embodiment of the present invention.

As shown in FIG. 2, in the first embodiment, a plurality of cold plates 1, 11 and 21 are connected in series. The cold plates 1, 11 and 21 have attachment surfaces 1a, 11a and 21a, respectively. In the case of the figure, the lower surface of each of the cold plates 1, 11 and 21 is used as the attachment surface, but the upper surface may also be used as the attachment surface. That is, one of the two surfaces corresponding to the planar shape of the semiconductor chip or the like to be cooled is used as the attachment surface among the six surfaces surrounding the coolant accommodating portion constituting the cold plate.

The cold plate 1 is provided with a first opening 2 and a second opening 2A. Each of these openings communicates with an internal coolant accommodating portion. The second opening 2A is connected to the outside (for example, a cooling water supply header pipe (not shown)) via a tube 4. A swivel joint 6 (the entire connection between the body-side connection pipe 3 and the tube-side connection pipe 5 in FIGS. 1A and 1B is referred to as a swivel joint) is connected to the first opening 2.

The cold plate 1 is connected to a second opening 12A of the cold plate 11 on the downstream side by a tube 14 via the swivel joint 6. Cooling water is supplied to the cold plate 11 by a tube 14.

In the illustrated example, the swivel joint 6 is directly attached to the first opening 2, but the swivel joint 6 may be attached via a member such as a pipe provided in the first opening 2. Further, a member such as a pipe may be provided in the second opening 2A, and the tube 4 may be attached via this pipe.

The cold plate 11 is connected to a second opening 22A of the cold plate 21 further downstream by a tube 24 via a swivel joint 16 attached to the first opening 12, and cooling water is supplied to this cold plate 21 by the tube 24 connected to the second opening 22A.

A swivel joint 26 is attached to a first opening 22 on the side where the cooling water of the cold plate 21 is discharged. Further, a tube 34 is attached to the first opening 22, and the cooling water is discharged to the outside (for example, a discharge header pipe (not shown)).

Note that FIG. 2 shows an example in which three cold plates 1, 11 and 21 are connected in series, but a plurality may be connected in series. That is, the number of cold plates is selected according to the number of heat-generating components to be cooled.

Figure 3:
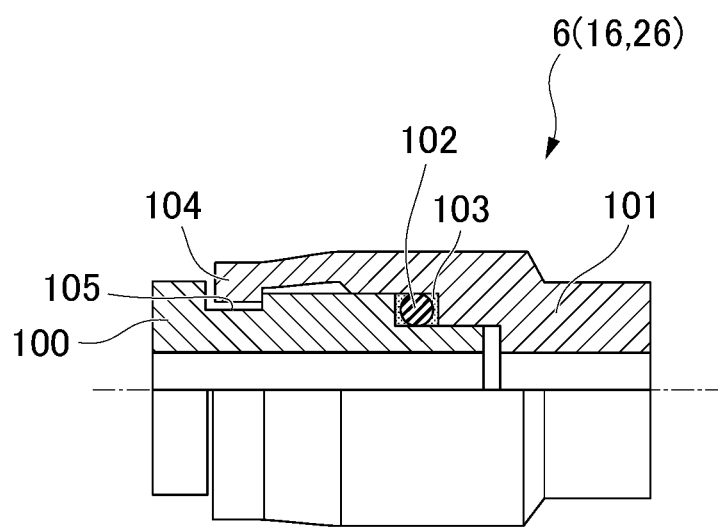
FIG. 3 is a cross-sectional view along the pipe axis showing a swivel joint used in the first embodiment.

The detailed structure of the swivel joint 6 will be described with reference to FIG. 3.

The swivel joint 6 has a shaft portion 100 corresponding to the body-side connection pipe 3 of FIGS. 1A and 1B and a body portion 101 corresponding to the tube-side connection pipe 5 as main constituent members.

The shaft portion 100 is formed in a tubular shape so as to receive the body portion 101. An O-ring 102 that can be elastically deformed while being fitted to the outer periphery of the end portion of the body portion 100 is provided in a space surrounded by the shaft portion 100 and the body portion 101. Grease 103 is applied so as to fill the gap around the O-ring 102. The O-ring 102 and the grease 103 make it possible to keep the inside of the swivel joint 6 liquid-tight.

The shaft portion 100 and the body portion 101 are connected to each other so as to be rotatable in the circumferential direction around the pipe axis, and the grease 103 is also applied to the overlapping portion between the outside of the shaft portion 100 and the inside of the body portion 101. As a result, smooth rotation of the shaft portion 100 and the body portion 101 and prevention of liquid leakage from the gap required for rotation are realized.

At the tip of the body portion 101 (left end in FIG. 3), a convex portion 104 having a protrusion extending inward in the radial direction is formed. A groove portion 105 that is recessed inward in the radial direction is formed on the outer circumference of the shaft portion 100. Due to the structure in which the convex portion 104 is fitted into the groove portion 105, it is possible to prevent the two members from being separated in the axial direction while allowing relative rotation between the shaft portion 100 and the body portion 101.

The procedure for assembling the swivel joint 6 (16, 26) will be described with reference to FIGS. 4A to 4C.

Figure 4A:
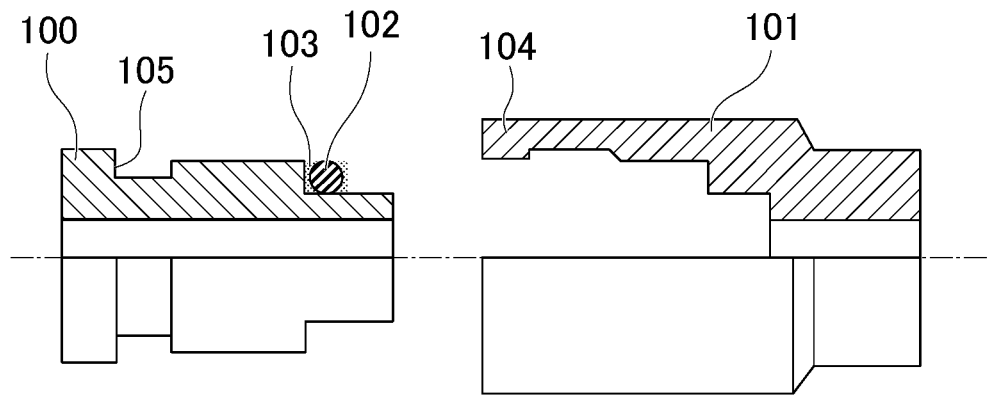
FIG. 4A is a cross-sectional view showing an example of an assembly procedure of the swivel joint of FIG. 3.
Figure 4B:
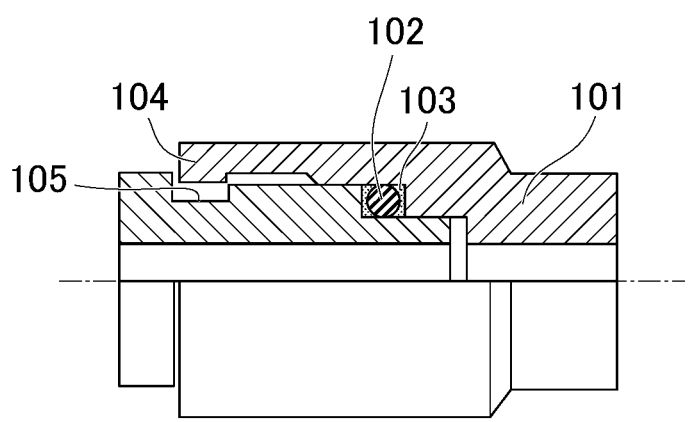
FIG. 4B is a cross-sectional view showing an example of an assembly procedure of the swivel joint of FIG. 3.
Figure 4C:
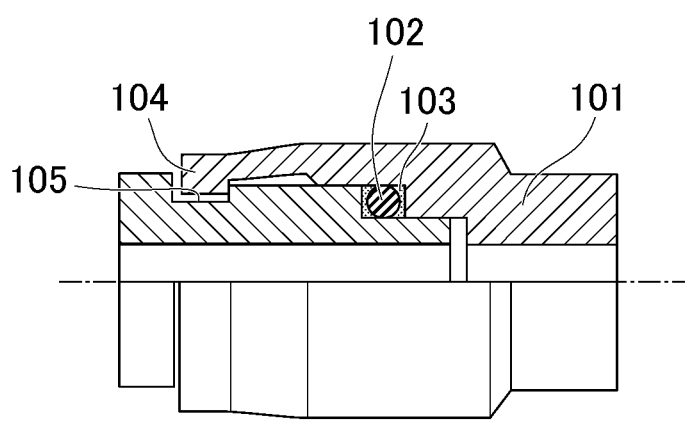
FIG. 4C is a cross-sectional view showing an example of an assembly procedure of the swivel joint of FIG. 3.

As shown in FIG. 4A, after applying the grease 103 to the outer periphery of the tip of the shaft portion 100 (the right end of FIG. 4A), the grease 103 is applied to the surface of the O-ring 102, which is attached to the tip of the shaft portion 100. Then, as shown in FIG. 4B, the tip of the shaft portion 100 is pushed into the tip end of the body portion 101 (the left end of FIG. 4B). Finally, as shown in FIG. 4C, the outside of the convex portion 104 is pushed inward in the radial direction by all-around caulking. Then, the inner protrusion of the convex portion 104 fits into the groove portion 105, whereby the shaft portion 100 and the body portion 101 are integrally connected to prevent axial separation.

In the cold plate having the above configuration, after being heat-exchanged with a heat-generating component (not shown) in contact with the cold plate 1, the cooling water supplied from the tube 4 is supplied from the swivel joint 6 to the cold plate 11 via the tube 14. In the cold plate 11, heat exchange occurs between the heat-generating component (not shown) in contact therewith and the cooling water, which is then supplied to the cold plate 21 from the swivel joint 16 via the tube 24. In the cold plate 21, heat exchange occurs between the heat-generating component (not shown) in contact therewith and the cooling water. Further, the cooling water in the cold plate 21 is discharged from the swivel joint 26 to the outside via the tube 34.

In the cold plates 1, 11 and 21 connected in this way, since the tubes 14, 24 and 34 are attached via the swivel joints 6, 16 and 26, the tubes 14, 24 and 34 can each rotate about the respective pipe axis. Accordingly, when the cold plates 1, 11 and 21 are attached to or removed from heat-generating components or the like, the tubes 14, 24 and 34 are less likely to undergo deformation such as twisting. This makes it possible to reduce the risk of damage to the tubes 4, 14, 24, 34 due to twisting, or leakage of cooling water due to deterioration.

A second embodiment of the present invention will be described with reference to FIGS. 5 to 7. This second embodiment relates to a device 40 configured by attaching a cold plate to a heat-generating component. The same components as those shown in FIGS. 1A and 1B to 4A to 4C are designated by the same reference numerals to simplify the description.

Figure 5:
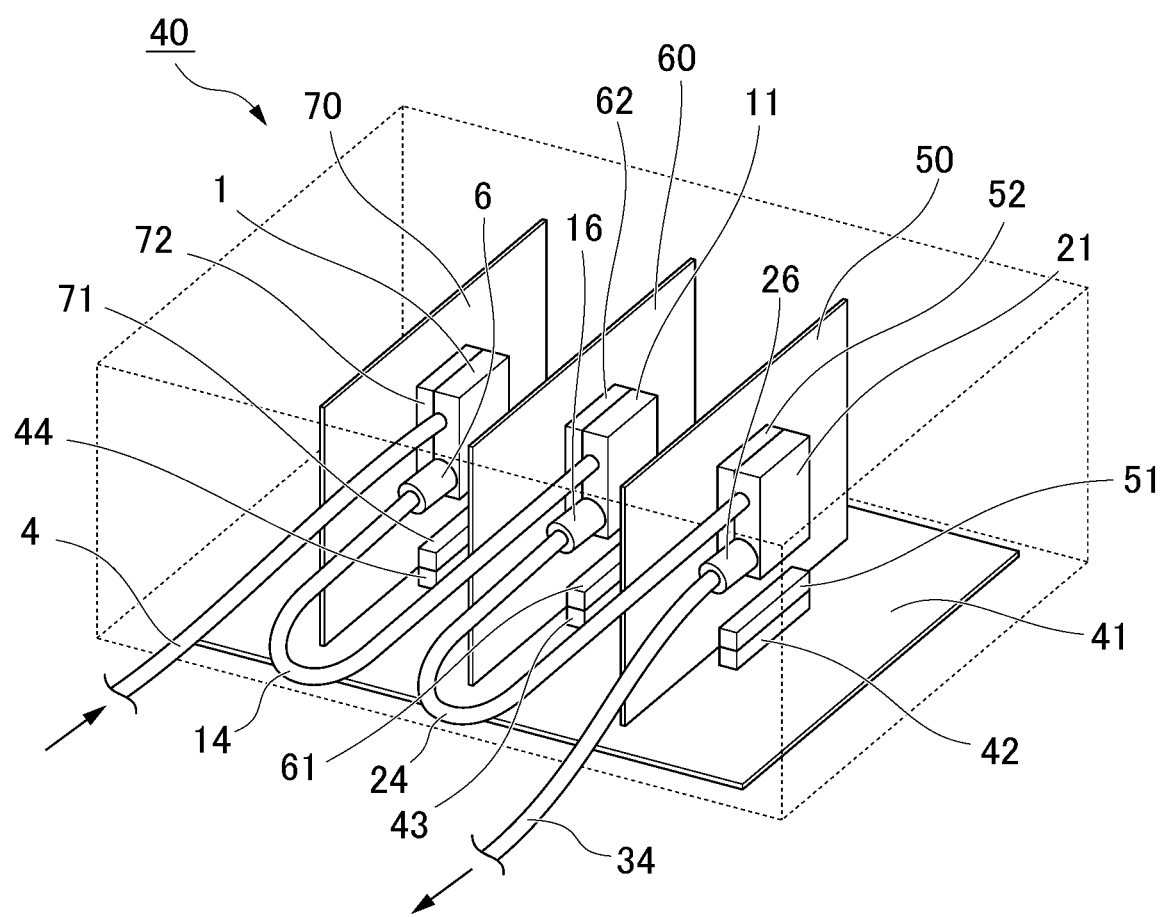
FIG. 5 is a perspective view showing a second embodiment in which the cold plate of the first embodiment is applied to cooling an electronic device.

In the device 40 shown in FIG. 5, such as a server, connectors (one of either male or female connectors) 42, 43 and 44 are attached to a substrate 41 arranged substantially horizontally, with the attachment/detachment direction being the direction intersecting the substrate 41 (vertical direction in FIG. 5).

A substrate 50 is attached to the connector 42 via a connector (the other connector of either of the male and female connector) 51. A heat-generating component 52 is attached to the substrate 50. That is, the conductor pattern formed on the substrate 50 is electrically connected to the conductor pattern on the substrate 41 via the connectors 42 and 51.

Similarly, a substrate 60 is attached to the connector 43 via a connector 61. A heat-generating component 62 is attached to the substrate 60, and a substrate 70 is attached to the connector 44 via a connector 71. A heat-generating component 72 is attached to the substrate 70.

The cold plate 1 is attached to the heat-generating component 72, the cold plate 11 is attached to the heat-generating component 62, and the cold plate 21 is attached to the heat-generating component 52. The heat-generating components 72, 62, and 52 are sequentially cooled by the cooling water supplied from the outside through the tube 4. The cooling water warmed by the heat of the heat-generating components is discharged to the outside through the tube 34.

That is, the cooling water supplied from the tube 4 to the cold plate 1 is heat-exchanged with the heat-generating component 72, which is in contact with the cold plate 1, and supplied from the swivel joint 6 to the cold plate 11 via the tube 14. In the cold plate 11, heat is exchanged between the heat-generating component 62 in contact therewith and the cooling water, which is supplied from the swivel joint 16 to the cold plate 21 via the tube 24. In the cold plate 21, heat is exchanged between the heat-generating component 52 in contact therewith and the cooling water. Further, the cooling water of the cold plate 21 is discharged from the swivel joint 26 to the outside through the tube 34.

Figure 6:
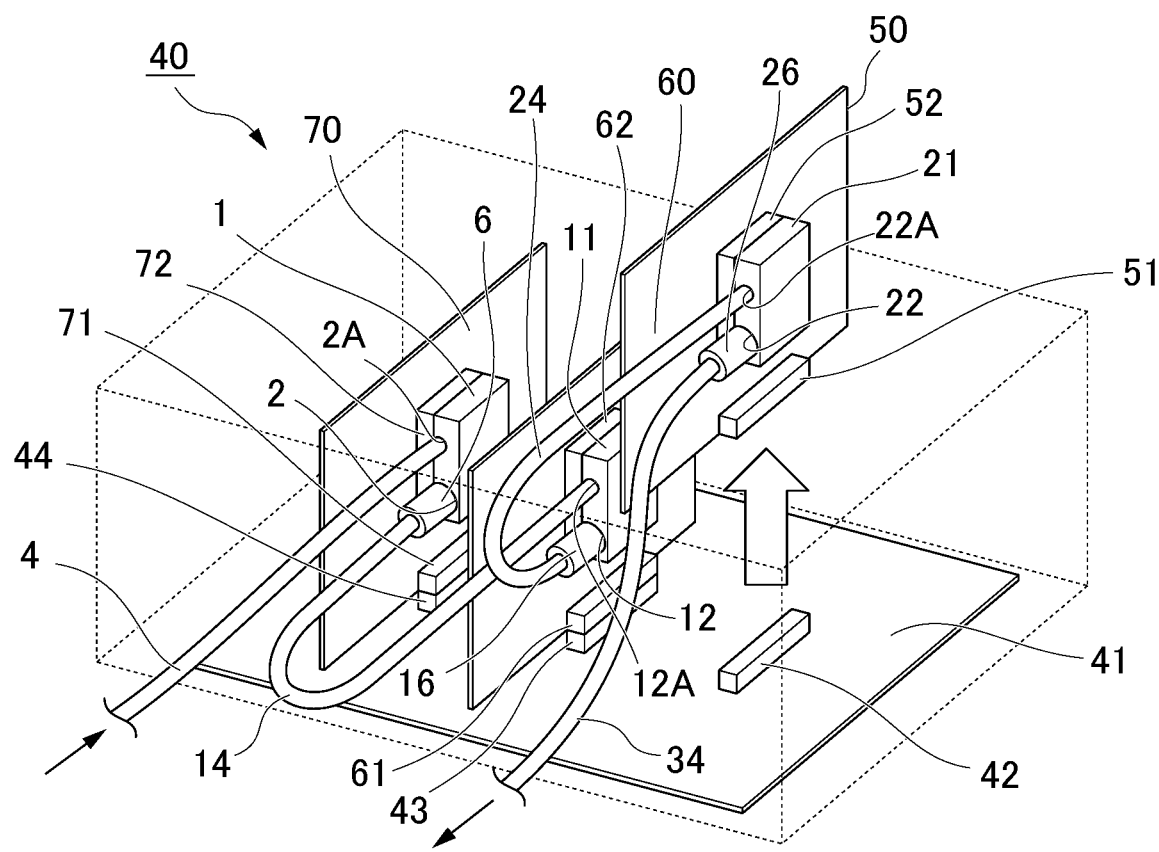
FIG. 6 is a perspective view showing an assembly procedure of the electronic device shown in FIG. 5.
Figure 7:
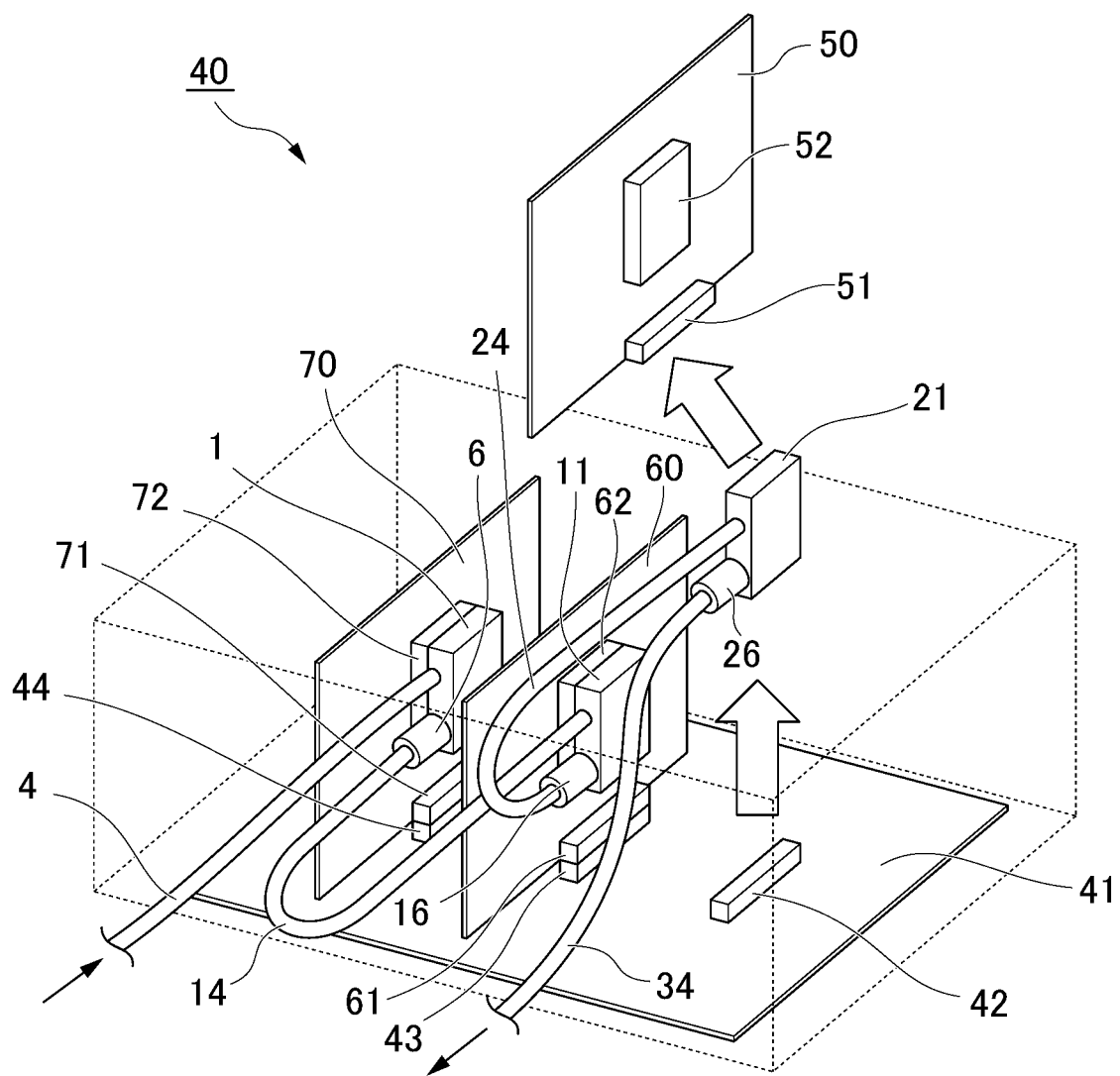
FIG. 7 is a perspective view showing a disassembly procedure of the electronic device shown in FIG. 5.
Figure 8:
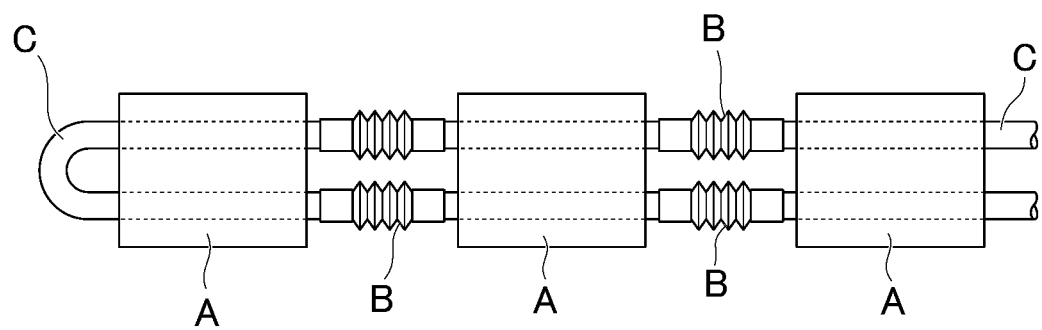
FIG. 8 is a plan view showing a conventional cold plate described in Patent Document 1.

With reference to FIGS. 6 and 7, the disassembly procedure associated with the replacement of the substrates in the device having the cold plates 1, 11 and 21 will be described.

As shown in FIG. 6, when replacing the substrate 50 of the device 40, a force is applied to the substrate 50 in the direction of the arrow (upper part of FIG. 6). Then, the connector 42 of the substrate 41 and the connector 51 of the substrate 50 are disengaged, whereby the substrate 50 moves in the direction of the arrow, to be taken out of the device 40.

At this time, the tube 24 connecting the cold plate 21 and the cold plate 11 tends to twist as the substrate 50 moves. However, at this time, the shaft portion 100 and the body portion 101 of the swivel joint 16 attached to the cold plate 11 rotate relative to each other to allow rotation in the direction centered on the pipe shaft. Accordingly, it is possible to remove the substrate 50 from the device 40 while absorbing most of the twist of the tube 24.

Further, as shown in FIG. 7, by removing the substrate 50 from the device 40, sufficient working space is secured for separating the heat-generating component 52 and the cold plate 21, and the substrate 50 can be replaced.

In the state shown in FIG. 7, the cold plate 21 is attached to a new substrate (not shown), and the connector (not shown) of the new substrate is moved in the direction opposite to the arrow in the drawing and inserted into the connector 42. Then, the replacement work is completed.

Even during the mounting of this new substrate, the rotation of the swivel joint 26 minimizes the twisting of the tubes 24 and 34 around the tube axis and thereby can prevent damage thereto.

In the second embodiment, the supply-side tube 24 and the discharge-side tube 34 are arranged so as to be displaced in the longitudinal direction of the side surface of the cold plate 21. Therefore, by rotating the swivel joint 26 attached to the tube 34 on the discharge side, the twist can be easily absorbed by the relative rotation of the tube 24 and the tube 34.

The number of substrates and cold plates is not limited to each of the above embodiments.

Further, the shape of the cold plate is not limited to the hexahedron as shown in the illustrated example, and may be another shape having an attachment surface to be attached to the heat generating element and a surface for attaching the tube or swivel joint on the supply side and the discharge side.

The swivel joint may be provided not in the opening on the discharge side of each cold plate but in the opening on the supply side, or may be provided in both the opening on the discharge side and opening on the supply side.

Further, the body portion constituting the swivel joint may be a configuration in which the shaft portion is attached to the cold plate by caulking, or a configuration in which the body portion of the swivel joint having a configuration in which the shaft portion and the body portion are connected by caulking is screwed into the cold plate.

Although embodiments of the present invention have been described in detail with reference to the drawings, the specific configuration is not limited to this embodiment, and design changes and the like within a range not deviating from the gist of the present invention are also included.

Priority is claimed on Japanese Patent Application No. 2018-245995, filed Dec. 27, 2018, the content of which is incorporated herein by reference.

INDUSTRIAL APPLICABILITY

The present invention can be used for a cold plate for cooling a device having a heat-generating component.

DESCRIPTION OF REFERENCE SYMBOLS 1, 11, 21: Cold plate
1a, 11a, 21a: Attachment surface
2: First opening
2A: Second opening
3: Body-side connection pipe (connection pipe)
4, 14, 24, 34: Tube
5: Tube-side connection pipe
6, 16, 26: Swivel joint
40: Device
41: Substrate
42, 43, 44: Connector
50, 60, 70: Substrate
51, 61, 71: Connector
52, 62, 72: Heat-generating component
100: Shaft portion
101: Body portion
102: O-ring
103: Grease
104: Convex portion
105: Groove portion

What is claimed is:

1. A cold plate comprising:
a first main body for accommodating a coolant in an accommodating portion surrounded by a plurality of surfaces including an attachment surface for contacting a cooling object;
a pipe-shaped body-side connection portion that is attached to a first opening that communicates with the accommodating portion of the first main body; and
a tube-side connection portion of which one end is rotatably attached to the body-side connection portion about the pipe axis and to the other end of which a tube is connected.

2. The cold plate according to claim 1, wherein the first opening and a second opening that communicates with the accommodating portion at a position different from the first opening are provided on a surface different from the attachment surface of the first main body.

3. The cold plate according to claim 2, further comprising a second main body in which a third opening communicating with an accommodating portion is connected to the tube of the first main body.

4. A device comprising the cold plate according to claim 3, a heat-generating component attached to an attachment surface of the cold plate, and a substrate on which the heat-generating component is mounted.

5. The cold plate according to claim 2, wherein a coolant is supplied from the second opening to the first main body, and the coolant is discharged from the main body through the first opening.

6. A connection pipe of a cold plate comprising:
a pipe-shaped body-side connection portion that is attached to a first opening that communicates with an accommodating portion of a main body for accommodating a coolant in the accommodating portion surrounded by a plurality of surfaces including an attachment surface for contacting a cooling target; and
a tube-side connection portion of which one end is rotatably attached to the body-side connection portion about the pipe axis and to the other end of which a tube is connected.

* * * * *